US006803823B2

(12) United States Patent
Wang et al.

(10) Patent No.: US 6,803,823 B2
(45) Date of Patent: Oct. 12, 2004

(54) CIRCUIT, APPARATUS AND METHOD FOR AN ADAPTIVE VOLTAGE SWING LIMITER

(75) Inventors: Yueyong Wang, Santa Clara, CA (US); Chanh Tran, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 38 days.

(21) Appl. No.: 10/184,148

(22) Filed: Jun. 27, 2002

(65) Prior Publication Data

US 2004/0000955 A1 Jan. 1, 2004

(51) Int. Cl.$^7$ ............................................. H03F 3/04
(52) U.S. Cl. ................................... 330/301; 330/253
(58) Field of Search ............................ 330/252, 253, 330/301

(56) References Cited

U.S. PATENT DOCUMENTS

| | | | | |
|---|---|---|---|---|
| 4,843,264 A | * | 6/1989 | Galbraith | 327/55 |
| 5,198,780 A | * | 3/1993 | Kase | 330/253 |
| 5,828,265 A | * | 10/1998 | Mensink et al. | 330/254 |
| 5,892,398 A | * | 4/1999 | Candy | 330/264 |
| 6,011,437 A | * | 1/2000 | Sutardja et al. | 330/254 |

* cited by examiner

Primary Examiner—Khanh Van Nguyen
(74) Attorney, Agent, or Firm—Vierra Magen Marcus Harmon & DeNiro LLP

(57) ABSTRACT

A circuit, apparatus and method for providing a balanced differential signal from incoming serial data having high or low voltage swings are provided in embodiments of the present invention. In an embodiment of the present invention, a circuit comprises a voltage source and a current source coupled to a node. A first electrical path is coupled to the voltage source and the node. A second electrical path is coupled to the voltage source and the node. The first path includes a first transistor having a first gate and a first channel. The first transistor gate is adapted to receive a reference voltage. The second path includes a second transistor having a second gate and a second channel. The second transistor gate is adapted to receive a data voltage that is variable as a positive and negative voltage relative to the reference voltage. A variable resistor is coupled to the first electrical path and the second electrical path, and provides a predetermined resistance responsive to a control signal. A signal processing circuit is coupled to the variable resistor and the node. The signal processing circuit generates a control signal responsive to the node voltage.

29 Claims, 9 Drawing Sheets

CIRCUIT, APPARATUS AND METHOD FOR AN ADAPTIVE VOLTAGE SWING LIMITER

FIELD OF THE INVENTION

The present invention relates to a receiving circuit, and in particular a single-ended signal to differential signal conversion circuit.

BACKGROUND OF THE RELATED ART

A differential amplifier often provides a differential output voltage in response to two input voltages. FIG. 1 illustrates a circuit 100 that is often referred to as a differential amplifier. A voltage source $V_{DD}$ is applied to sources of transistors 101 and 103. Gates of transistors 101 and 103 are coupled to ground 109. Drains of transistors 101 and 103 are coupled to terminals 121 and 122, respectively. Terminals 121 and 122 output a differential output voltage $V_{OUT}$. Drains of transistors 101 and 103 are also coupled to drains of transistors 102 and 104, respectively. An input voltage $V_{IN}$ is applied to a gate of transistor 102 and a reference voltage $V_{REF}$ is applied to the gate of transistor 104. Sources of transistors 102 and 104 are coupled to a current source, and in particular transistor 108 having a source coupled to ground 109 and a drain coupled to the sources of transistors 102 and 104. A bias voltage $V_{BIAS}$ is applied to a gate of transistor 108. Transistors 101 and 102 form a first electrical path from a voltage source $V_{DD}$ and current source (transistor) 108 while transistors 103 and 104 form a second electrical path. An advantage of such a differential amplifier is that the matched electrical paths cancel undesirable voltage swings common to input voltages, which may for instance be caused by temperature variations or noise, whereas differences between the input voltages are amplified.

A differential output voltage $V_{OUT}$, illustrated by curve 203 in FIG. 2c, is output at terminals 121 and 122 in response to voltage $V_{IN}$ illustrated by curve 200 in FIG. 2a. In particular, curve 202, illustrated in FIG. 2b, represents an output voltage at terminal 121 and curve 201 represents an output voltage at terminal 122 in response to $V_{IN}$ represented by curve 200 illustrated in FIG. 2a. Reference voltage $V_{REF}$ is represented by curve (flat line) 204 in FIG. 2a. The two output voltages at terminals 121 and 122 are combined to obtain the differential output voltage $V_{OUT}$ as illustrated by curve 203 in FIG. 2c. Differential output voltage $V_{OUT}$ has a duty cycle of approximately 53.6%, as opposed to an ideal 50%.

A receiving circuit often includes amplifying stage and sampling stage. Differential amplifiers are often used in amplifying stage of a receiving circuit in order to restore/amplify the incoming data. Ideally, the amplifier should maintain the timing information of the incoming data in order to have the sampling stage operate correctly, i.e., if a periodic incoming data has 50% duty cycle, the amplified differential signal should also have 50% duty cycle.

However, certain serial data signals are single-ended signals. This single-ended signal usually needs to be converted into a differential signal, and a differential amplifier is commonly used for this purpose. However, a differential amplifier may create erroneous or unbalanced amplified differential signals and degrade timing margin of a receiving circuit. For example, when a double date rate transmitter is transmitting a single-ended signal of "1" and "0" during a clock cycle, an optimal signal sampling stage will receive an amplified signal with an evenly distributed bit duration of "1" and "0". This will typically ensure both "1" and "0" have optimal timing margin. If any one of these two bits "1" or "0" have a longer bit duration than the other, system timing margin is degraded. A data input signal may include either a relatively large and/or small voltage level swing. A differential amplifier may be designed to handle a relatively low voltage level swing. This means a differential amplifier is acting as a gain stage. Yet a gain stage generally does not handle input signals properly with large voltage level swings, as one of the input transistors will be pushed out of saturation. For relatively large single-ended input voltage signals as illustrated in FIG. 2a, where one of the input devices is pushed into linear region, current steering does not work properly. Thus, the characteristic of the amplified differential signals may be different for large voltage swings in large data eyes than for small voltage swings in small data eyes. Furthermore, the input voltage swings of a receiving circuit may not be predictable. Thus, an amplifier that can properly operate with both large and small voltage swing is desirable.

Some differential amplifiers have addressed unbalanced amplified differential signals by providing unbalanced loads on respective electrical paths. This technique may reduce duty cycle error for large input voltage levels, but it degrades performance for small voltage inputs. Further, such a technique does not offer common mode noise rejection, since each electrical path should be ideally symmetrical in nature.

Therefore, it is desirable to provide a circuit and method for providing a balanced differential output voltage signal for both relatively small and large voltage level inputs while also being able to reject noise. It is also desirable to provide an apparatus that produces an improved duty cycle clock signal and thereby reduce data error rates of incoming serial single-ended data.

SUMMARY

A circuit, apparatus and method for providing a balanced differential signal from incoming single-ended serial data having high or low voltage swings are provided in embodiments of the present invention.

In an embodiment of the present invention, a circuit comprises a voltage source and a current source coupled to a node. A first electrical path is coupled to the voltage source and the node. A second electrical path is coupled to the voltage source and the node. The first path includes a first transistor having a first gate and a first channel. The first gate is adapted to receive a reference voltage. The second path includes a second transistor having a second gate and a second channel. The second gate is adapted to receive a data voltage that is variable as a positive and negative voltage relative to the reference voltage. A variable resistor is coupled to the first electrical path and the second electrical path, and provides a predetermined resistance responsive to a node voltage at the node.

According to another embodiment of the present invention, the circuit further comprises a signal processing circuit that is coupled to the variable resistor and the node. The signal processing circuit generates a control signal responsive to the node voltage.

According to an embodiment of the present invention, the circuit comprises a third transistor having a third gate and a third channel. The first path includes the third channel having a first resistance between the voltage source and the first transistor. The second path includes a fourth transistor having a fourth gate and a fourth channel having a second resistance between the voltage source and the second transistor.

According to another embodiment of the present invention, the current source includes a fifth transistor having a drain coupled to the node and a source coupled to a ground. The fifth transistor has a gate adapted to receive a bias voltage.

According to still another embodiment of the present invention, the variable resistor includes a sixth transistor having a source, a drain and a gate. The source is coupled to the first path and the drain is coupled to the second path.

According to an embodiment of the present invention, the signal processing circuit comprises a seventh transistor having a source, a drain and a gate. The source is coupled to the voltage source and the gate is coupled to the sixth transistor gate. An eighth transistor has a source, a drain and a gate. The eighth transistor drain is coupled to the seventh transistor drain and the eighth transistor gate is coupled to the node.

According to an embodiment of the present invention, the first transistor, second transistor, fifth transistor, and eighth transistor are n-type transistors.

According to an embodiment of the present invention, the third transistor, fourth transistor, sixth transistor, and seventh transistor are p-type transistors.

According to an embodiment of the present invention, the circuit is a differential amplifier circuit used in a double data rate receiving circuit for amplifying a single-ended data signal and converting the single-ended data signal into a differential signal used by a sampling stage.

According to an embodiment of the present invention, the circuit is in a memory device.

According to an embodiment of the present invention, the circuit is in a memory device controller.

According to an embodiment of the present invention, an apparatus comprising a transmit circuit transmits serial data to a receive circuit that generates an output signal responsive to the serial data. The receive circuit includes a first electrical path coupled to a voltage source and a node. A second electrical path is coupled to the voltage source and the node. A first transistor having a first gate and a first channel is included in the first path. The first transistor gate is adapted to receive a reference voltage. A second transistor having a second gate and a second channel is included in the second path. The second transistor gate is adapted to receive a data voltage, corresponding to the serial data that is variable as a positive and negative voltage relative to the reference voltage. A variable resistor is coupled to the first electrical path and the second electrical path. The variable resistor provides a predetermined resistance responsive to a node voltage at the node.

According to an embodiment of the present invention, a method comprises the steps of receiving serial data having a voltage level and applying the voltage level to a first transistor in a first electrical path. A reference voltage is applied to a second transistor in a second electrical path. The first electronic path is coupled to the second electronic path at a node. A variable resistance is provided between the first electronic path and the second electronic path responsive to a voltage at the node. Output voltage is output from the first and second electrical paths. A voltage source is applied to the first and second electrical paths and a current source is applied to the node. An amplified and converted data signal is generated responsive to the output voltage.

These and other embodiments of the present invention, as well as other aspects and advantages are described in more detail in conjunction with the figures, the detailed description, and the claims that follow.

DETAILED DESCRIPTION

Figure 4:
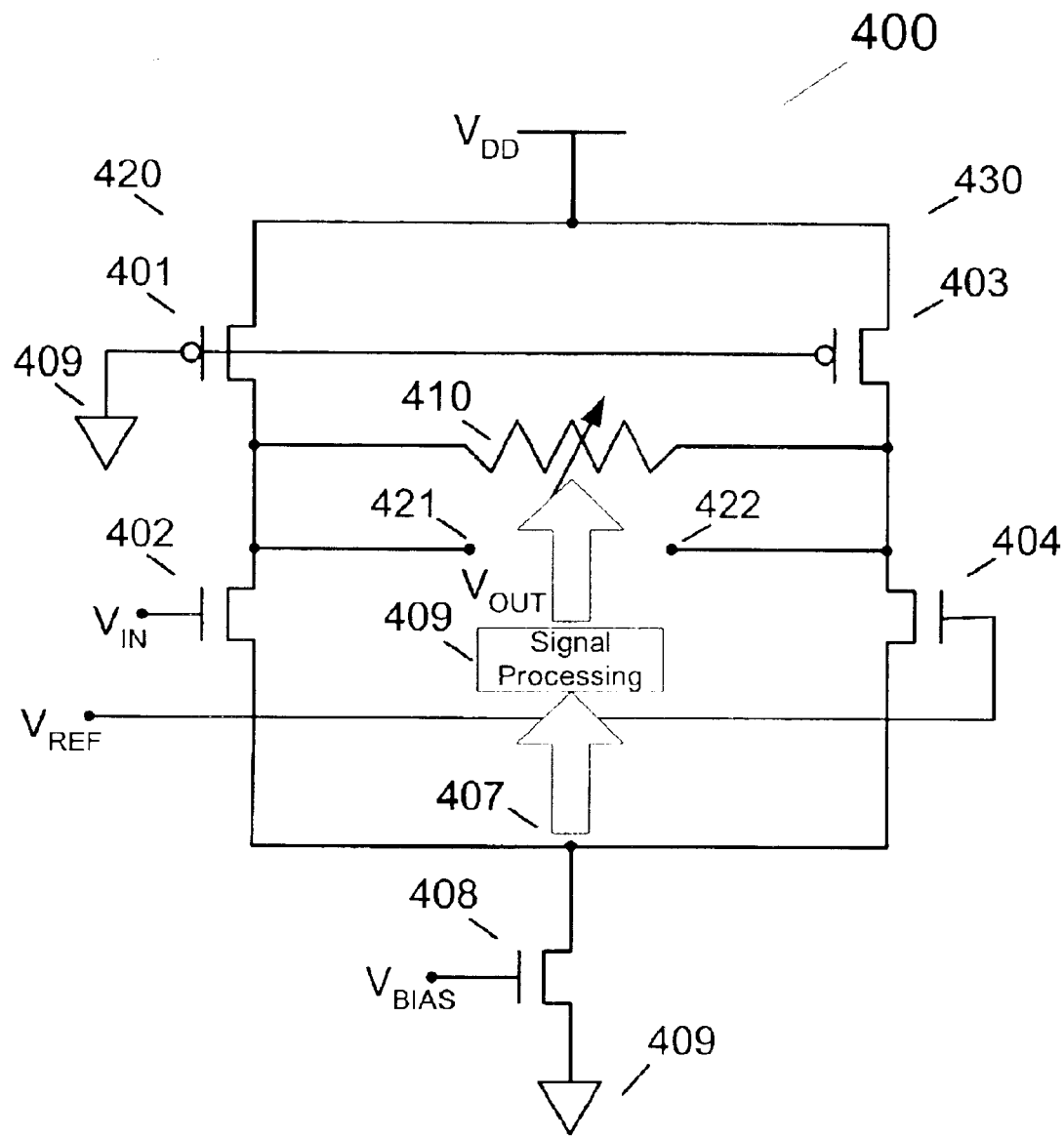
FIGS. 4 and 5 are schematics of circuits in accordance with embodiments of the present invention.

FIG. 4 illustrates a circuit 400 according to an embodiment of the present invention. A voltage source $V_{DD}$ is coupled to electronic paths 420 and 430, including transistors 401 and 402, and transistors 403 and 404, respectively. In particular, a voltage source $V_{DD}$ is applied to sources of transistors 401 and 403. In an embodiment of the present invention, transistors 401 and 403 are p-type transistors. In an embodiment of the present invention, voltage source $V_{DD}$ is approximately 1.8 volts. The gates of transistors 401 and 403 are coupled to ground 409. Drains of transistors 401 and 403 are coupled to terminals 421 and 422, respectively. Terminals 421 and 422 provide a differential output voltage $V_{OUT}$. Drains of transistors 401 and 403 are also coupled to the drains of transistors 402 and 404, respectively. In an embodiment of the present invention, transistors 402, 404 and 408 are n-type transistors. An input voltage $V_{IN}$ is applied to a gate of transistor 402 and a reference voltage $V_{REF}$ is applied to a gate of transistor 404. In an embodiment of the present invention, a reference voltage $V_{REF}$ is approximately 1.4 volts. Sources of transistors 402 and 404 are coupled to a current source, and in particular transistor 408 having a source coupled to ground 409 and a drain coupled to sources of transistors 402 and 404. A bias voltage $V_{BIAS}$ is applied to a gate of transistor 408. In an embodiment of the present invention, a bias voltage $V_{BIAS}$ is approximately 0.7 volts.

Figure 2A:
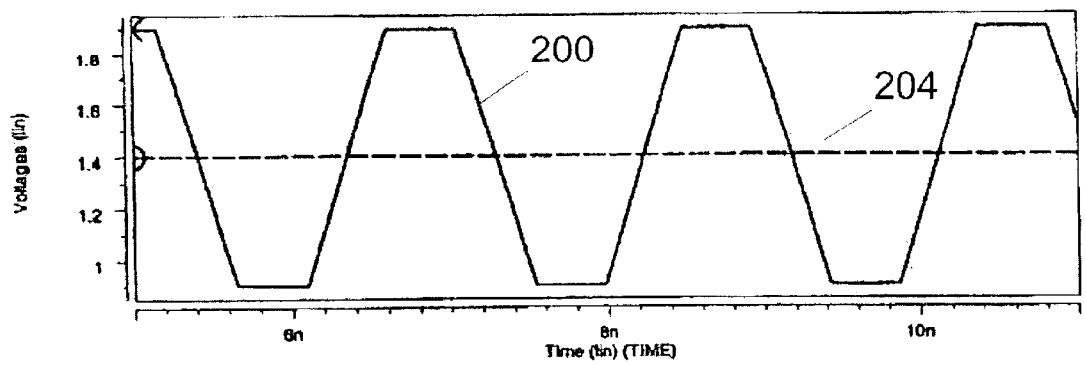
FIGS. 2a, 2b and 2c are plots of the voltage characteristics of the differential amplifier of FIG. 1.
Figure 2B:
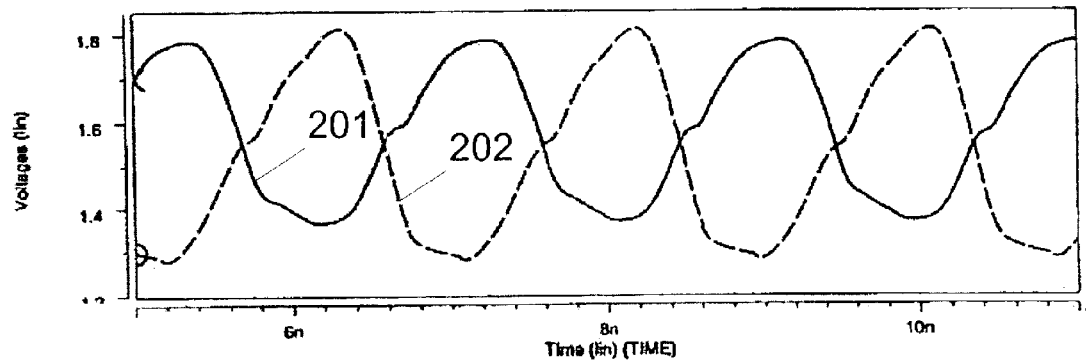
Figure 2C:
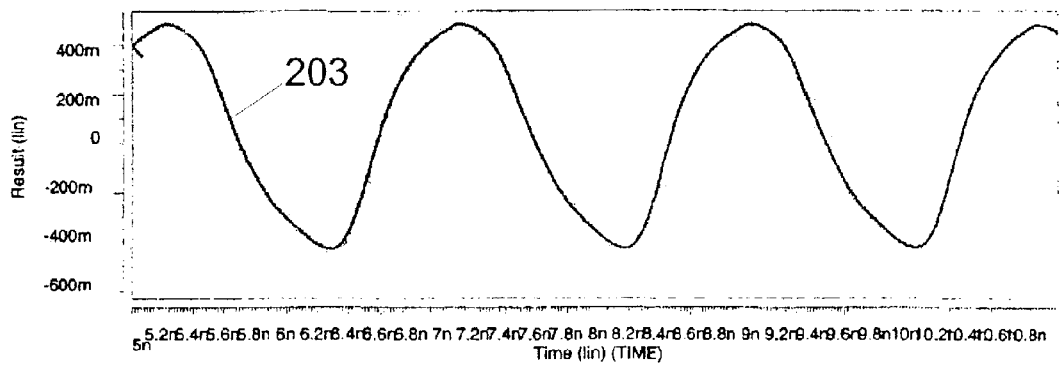
Figures 3A, 3B:
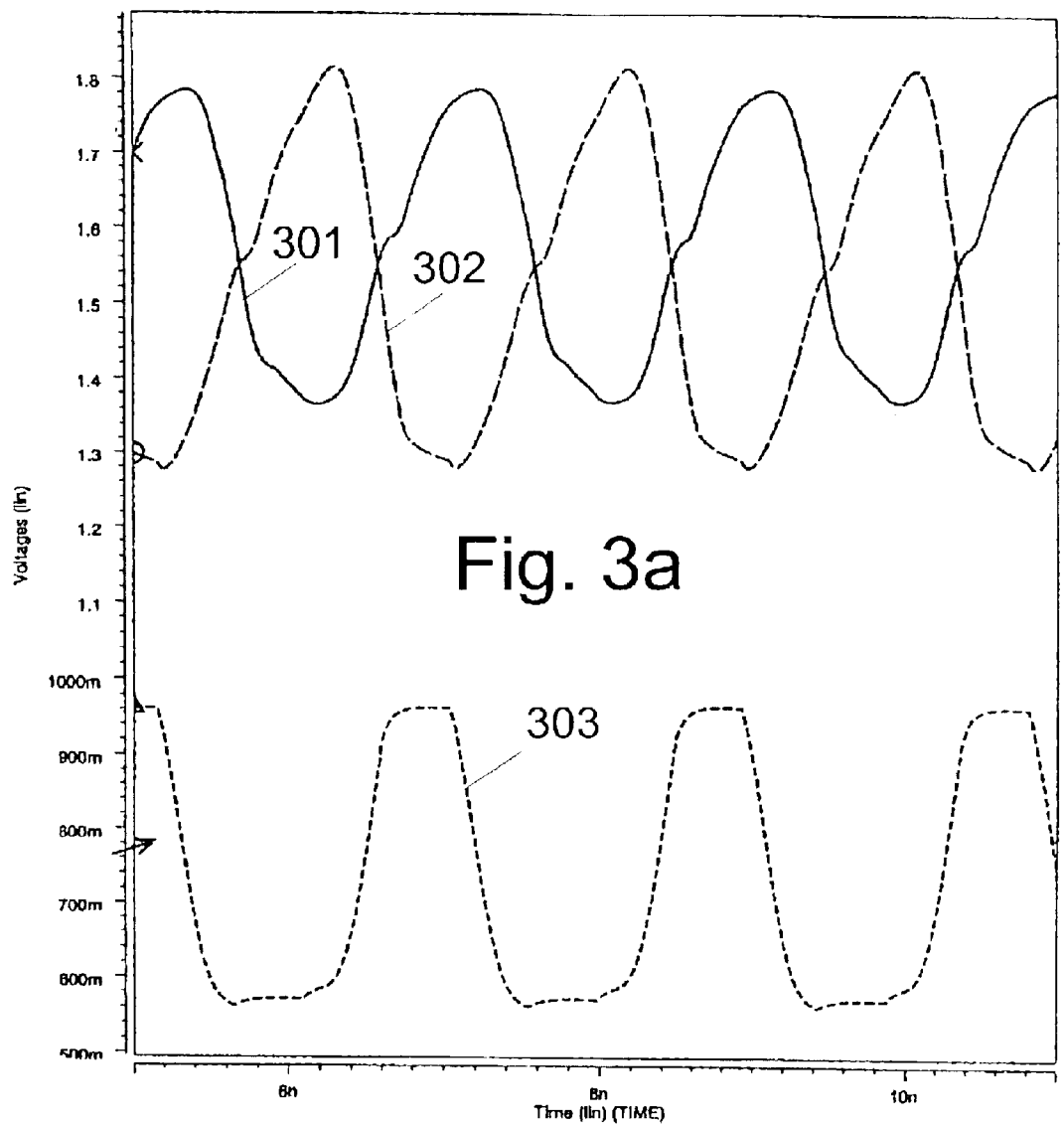
FIGS. 3a and 3b are plots of the voltage characteristics of an output and a node of the differential amplifier shown in FIG. 1.

FIGS. 3a and 3b illustrate a relationship between a voltage at node 407 and voltage output at terminals 421 and 422. FIG. 3a shows curve 302 representing a voltage output at terminal 421 in response to input voltage $V_{IN}$ illustrated in FIG. 2a. Likewise, curve 301 represents a voltage output at terminal 422 in response to input voltage $V_{IN}$. A voltage level at node 407 acts as a source-followed pattern of input voltage $V_{IN}$. As input voltage $V_{IN}$ goes high, transistor 402 of the input pair is out of a saturation region and it results in a larger voltage swing than when input voltage $V_{IN}$ goes low as shown in FIG. 2a.

In order to reduce large voltage swings, a variable resistor 410 is positioned between electrical paths 420 and 430. Signal processing circuit 409 outputs a control signal to select a resistance value of variable resistor 410 in response to a voltage level at node 407.

Figure 5:
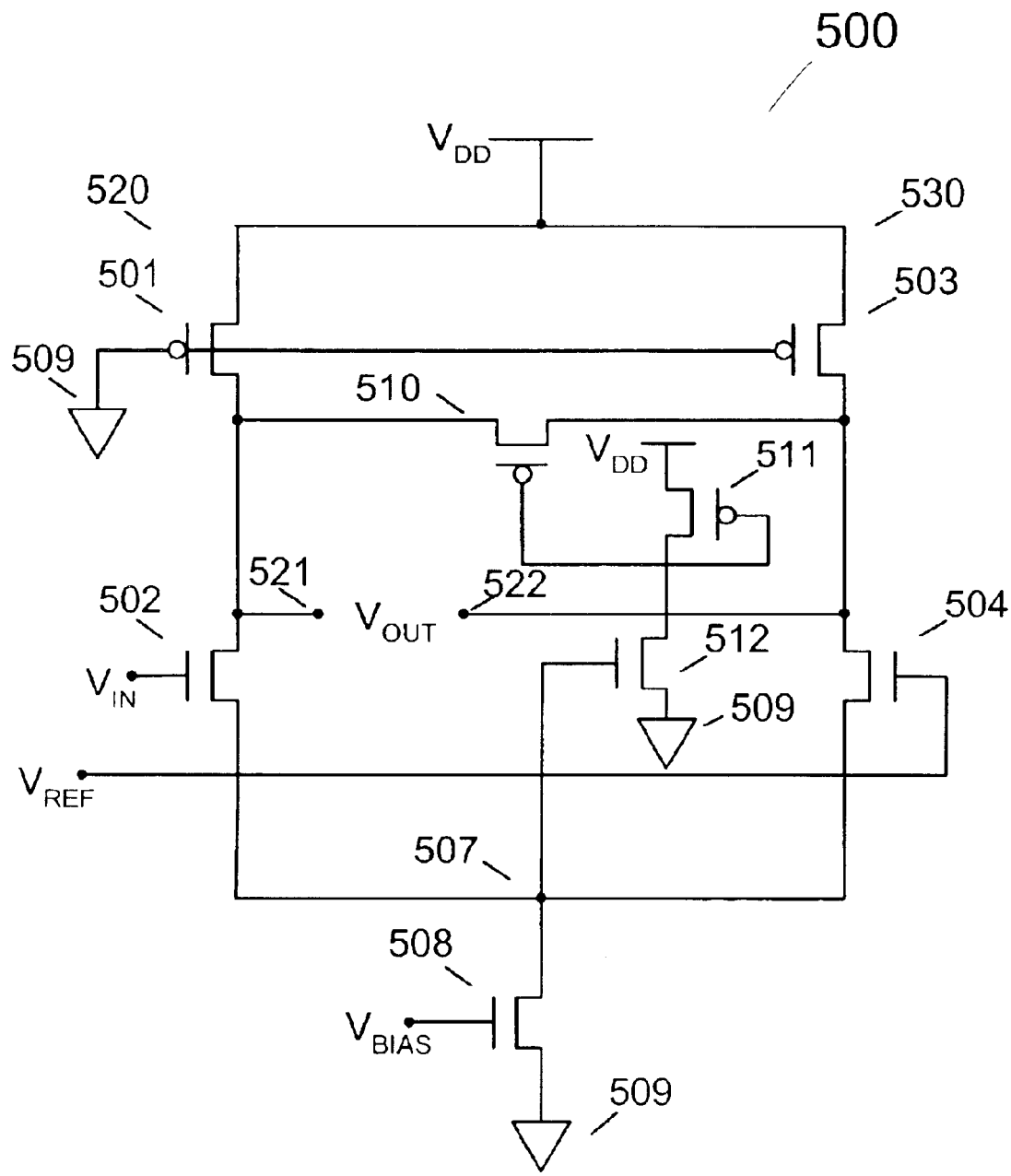

FIG. 5 illustrates a circuit 500, similar to circuit 400, in an alternate embodiment of the present invention. A voltage source $V_{DD}$ is coupled to electronic paths 520 and 530, including transistors 501 and 502, and transistors 503 and 504, respectively. In particular, a voltage source $V_{DD}$ is applied to sources of transistors 501 and 503. In an embodiment of the present invention, transistors 501, 503, 510 and 511 are p-type transistors. In an embodiment of the present invention, voltage source $V_{DD}$ is approximately 1.8 volts. Gates of transistors 501 and 503 are coupled to ground 509. Drains of transistors 501 and 503 are coupled to terminals 521 and 522, respectively. Terminals 521 and 522 provide a differential output voltage $V_{OUT}$. Drains of transistors 501 and 503 are also coupled to drains of transistors 502 and 504, respectively. In an embodiment of the present invention, transistors 502, 504, 508 and 512 are n-type transistors. An input voltage $V_{IN}$ is applied to a gate of transistor 502 and a reference voltage $V_{REF}$ is applied to a gate of transistor 504. In an embodiment of the present invention, a reference voltage $V_{REF}$ is approximately 1.4 volts. Sources of transistors 502 and 504 are coupled to a current source, and in particular transistor 508 having a source coupled to ground 509 and a drain coupled to sources of transistors 502 and 504. A bias voltage $V_{BIAS}$ is applied to a gate of transistor 508. In an embodiment of the present invention, a bias voltage $V_{BIAS}$ is approximately 0.7 volts.

In an embodiment of the present invention, transistor 510 is used to provide a variable resistance between electrical paths 520 and 530. In particular, a source of transistor 510 is coupled to a drain of transistor 501 and a drain of transistor 510 is coupled to a drain of transistor 503. In an embodiment of the present invention, transistors 511 and 512 are used to provide a control signal to a gate of transistor 510 in response to a voltage level at node 507. A source of transistor 511 is coupled to voltage source $V_{DD}$ and a gate of transistor 511 is coupled to a gate of transistor 510. A drain of transistor 512 is coupled to a drain of transistor 511 and a source of transistor 512 is coupled to ground 509. A gate of transistor 512 is coupled to node 507.

Figure 1:
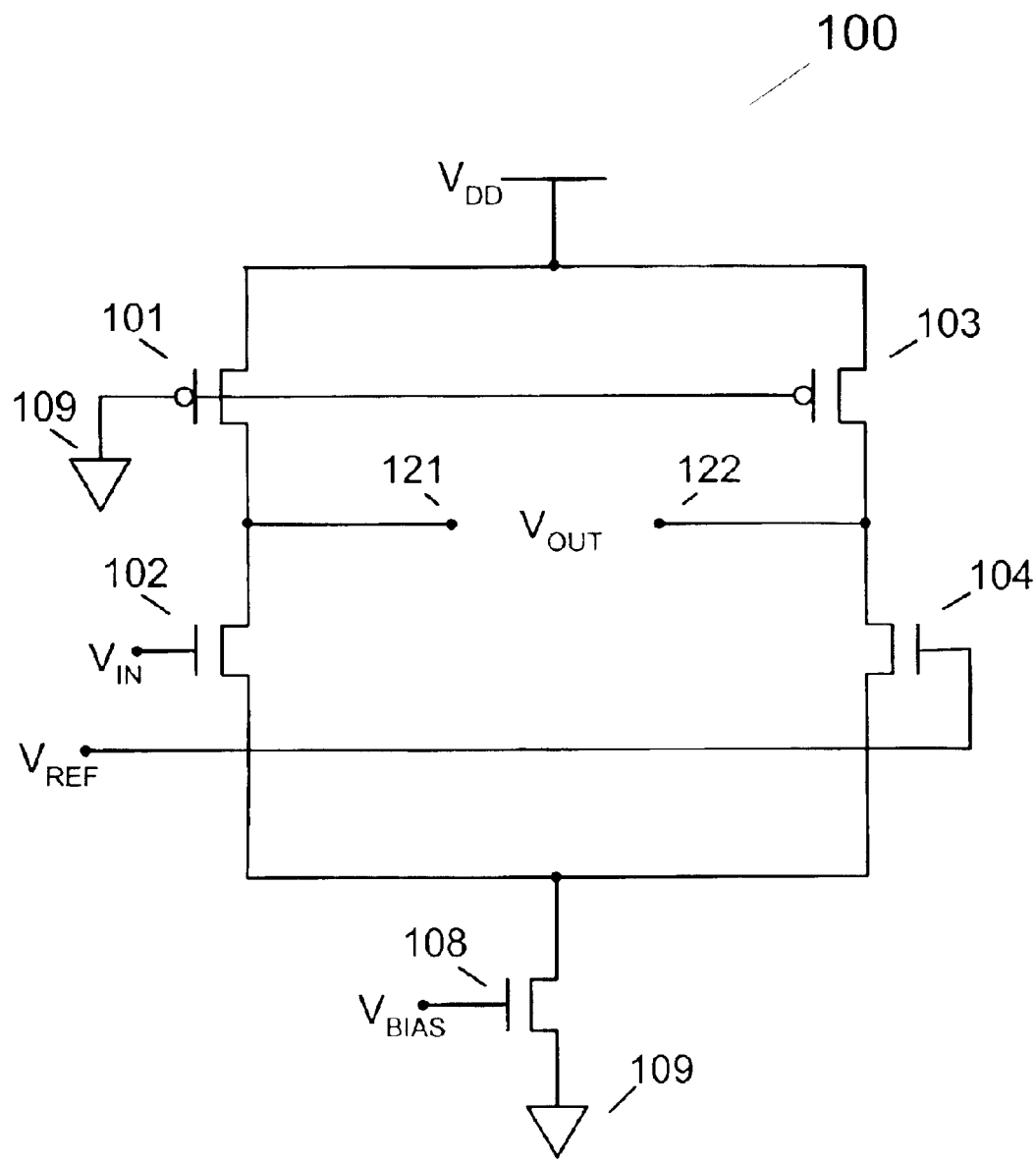
FIG. 1 is a schematic of a differential amplifier.
Figure 6A:
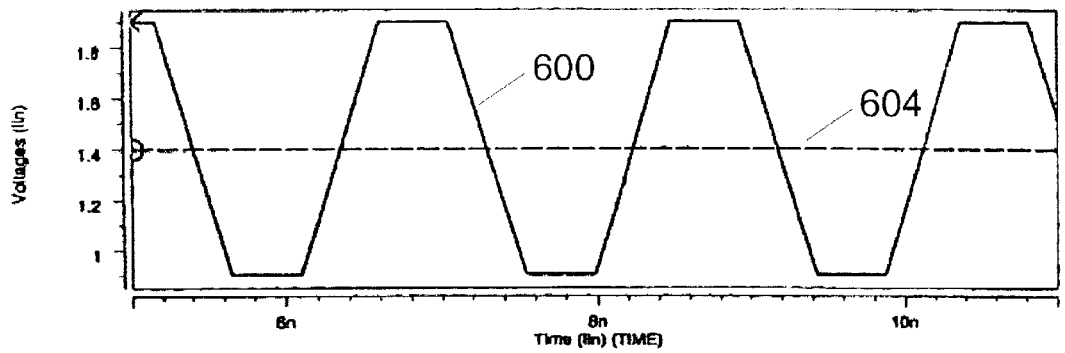
FIGS. 6a 6b and 6c are plots of voltage characteristics of inputs and outputs of the circuits shown in FIGS. 4 and 5 in accordance with embodiments of the present invention.
Figure 6B:
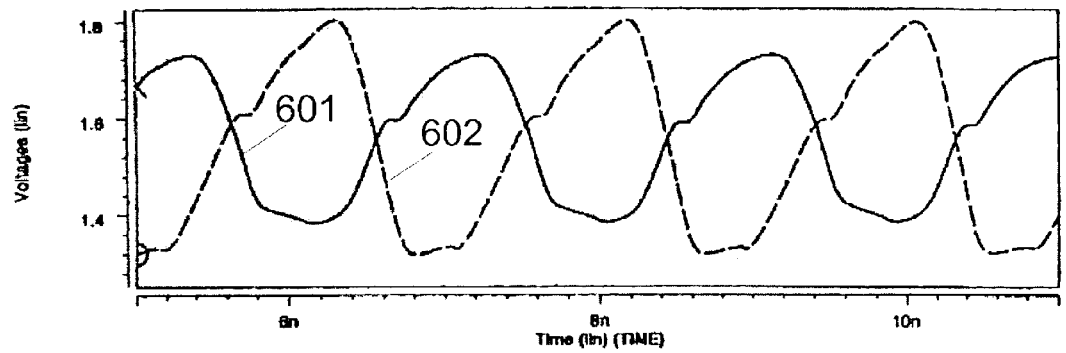
Figure 6C:
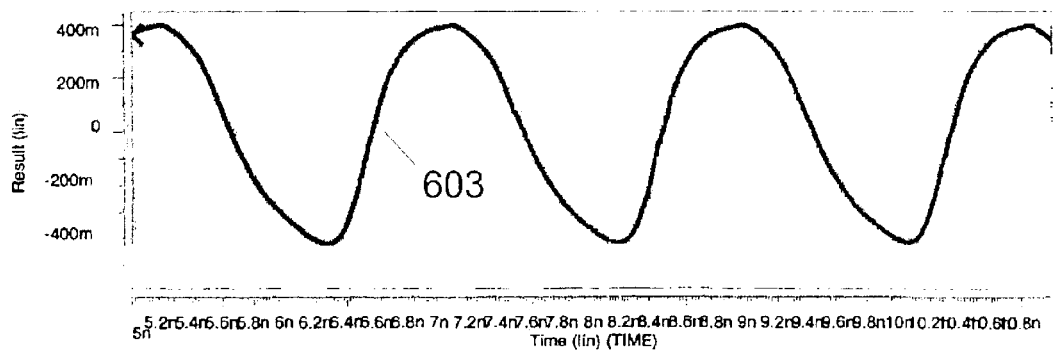

In an embodiment of the present invention, input voltage $V_{IN}$ has an alternating value having an amplitude of approximately 1 volt and a period of approximately 2 nanoseconds as represented by curve 600 in FIG. 6a. A differential output voltage $V_{OUT}$, illustrated by curve 603 in FIG. 6c, is output at terminals 521 and 522 in response to input voltage $V_{IN}$ illustrated in FIG. 6a. In particular, curve 602, illustrated in FIG. 6b, represents an output voltage at terminal 521 and curve 601 represents an output voltage at terminal 522 in response to input voltage $V_{IN}$ represented by curve 600 illustrated in FIG. 6a. Reference voltage $V_{REF}$ is represented by curve (flat line) 604 in FIG. 6a. $V_{REF}$ is typically 1.4 volts. The two output voltages at terminals 521 and 522 are combined to obtain the differential output voltage $V_{OUT}$ as illustrated by curve 603 in FIG. 6c. Differential output voltage $V_{OUT}$ has an improved duty cycle of approximate 51.5% compared to an approximate duty cycle of 53.6% produced by circuit 100 shown in FIG. 1. This improved duty cycle provides an improved receiving timing margin, since a worst case timing margin is based on the smallest bit duration.

Figure 7A:
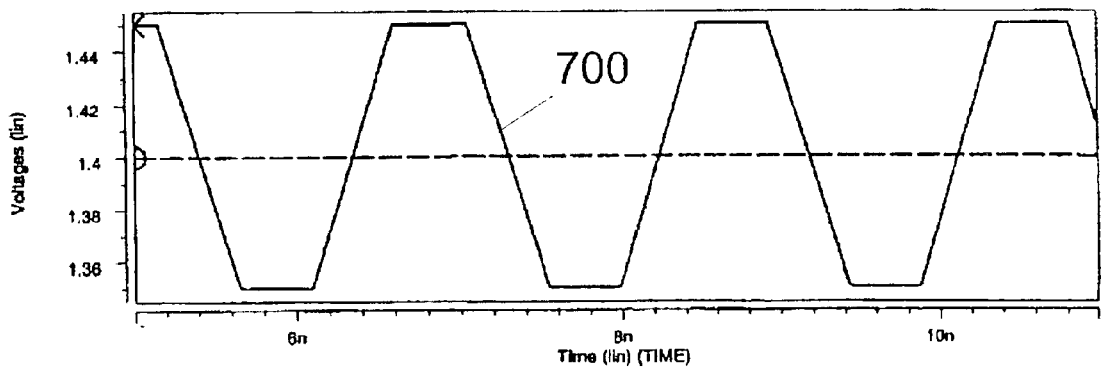
FIGS. 7a, 7b and 7c are plots of small voltage characteristics of inputs and outputs of the circuits shown in FIGS. 4 and 5 in accordance with embodiments of the present invention.
Figure 7B:
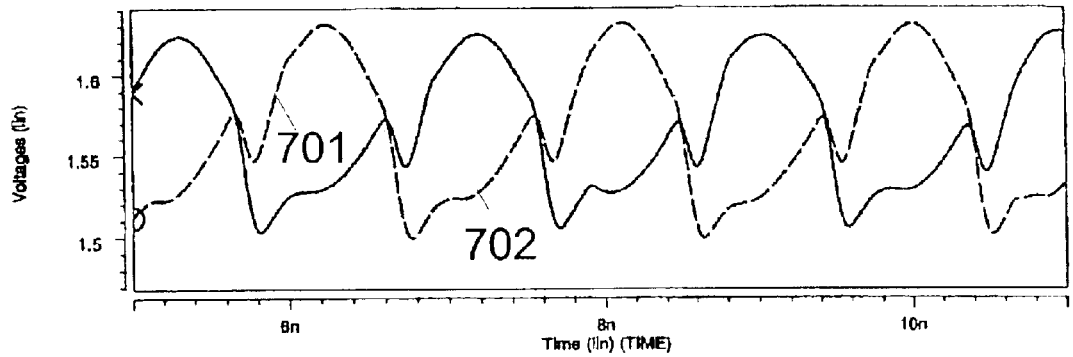
Figure 7C:
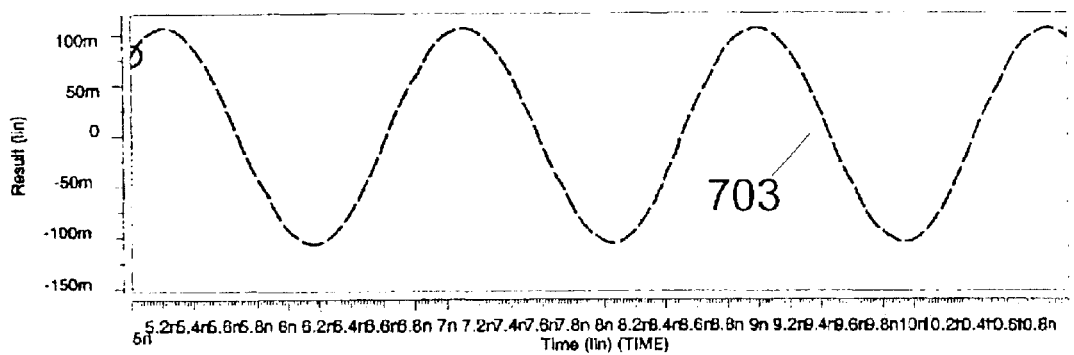

FIGS. 7a, 7b and 7c, similar to FIGS. 6a, 6b and 6c, illustrate a relatively small input voltage $V_{IN}$ and resulting output voltages at terminals 521 and 522 of circuit 500, and in particular differential output voltage $V_{OUT}$ represented as curve 703 in FIG. 7c. Input voltage $V_{IN}$ represented as curve 700 has an amplitude of 100 mv and a period of approximately 2 ns. Curve 701, illustrated in FIG. 7b, represents an output voltage at terminal 521 and curve 702 represents an output voltage at terminal 522 in response to input voltage $V_{IN}$ shown in FIG. 7a. With this relatively small input voltage $V_{IN}$, circuit 500 produces a duty cycle of 50.1%.

Figure 8:
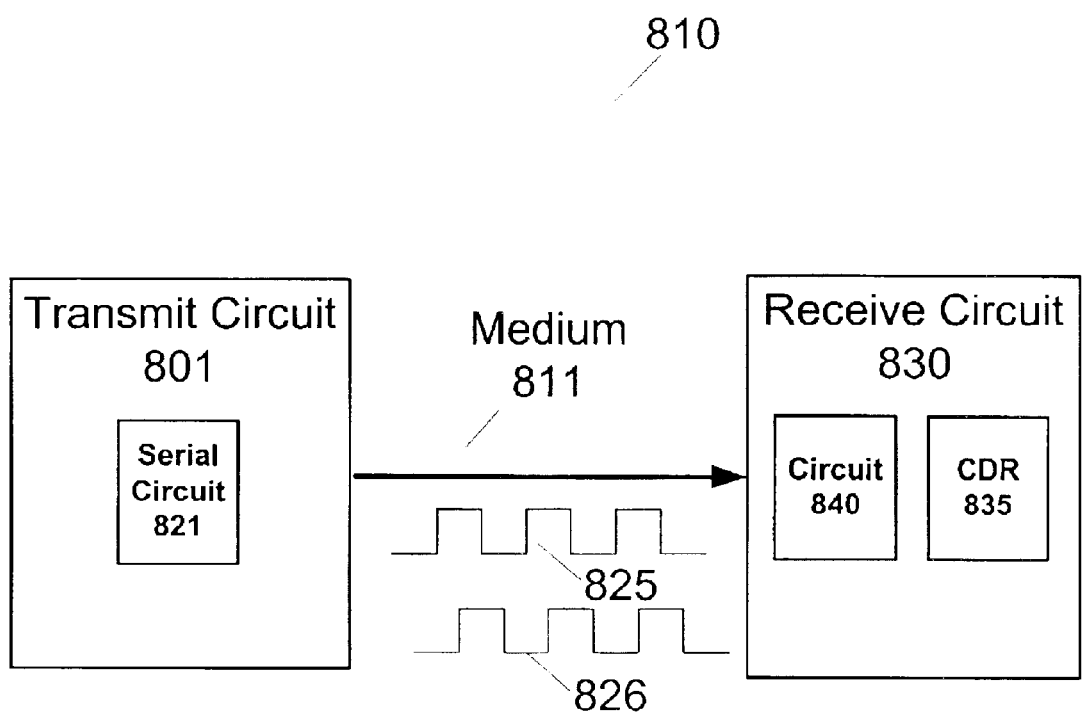
FIG. 8 illustrates a communication apparatus having an adaptive swing limiter circuit in accordance with an embodiment of the present invention.

FIG. 8 illustrates a communication apparatus 810, such as a Double Data Rate ("DDR") system, according to an embodiment of the present invention. In an embodiment of the present invention, communication apparatus 810 includes a transmit circuit 801 and a receive circuit 830 coupled by medium 811. In an embodiment of the present invention, transmit circuit 801, and in particular serial circuit 821, generates serial single-ended data 825 on medium 811 to receive circuit 830. A single-ended clock signal 826 is also sent via medium 811. In an embodiment of the present invention, transmit circuit 801 is a memory controller. In an alternate embodiment of the present invention receive circuit 830 is a memory device, such as a Dynamic Random Access Memory ("DRAM") device or a Rambus Dynamic Random Access Memory ("RDRAM") device.

In an embodiment of the present invention, medium 811 is a wire or set of wires for transporting signals, such as voltage signals. In an embodiment of the present invention, medium 811 is a bidirectional data bus that may carry data information, control information or both. In an alternate embodiment of the present invention, medium 811 is a unidirectional bus. In still a further embodiment of the present invention, medium 811 includes a wireless or photonics connection.

Receive circuit 830 includes a Clock Data Recovery unit ("CDR") 835 for actively looking for transitions in the incoming data pattern and phase aligns the sampling clock edges with respect to the incoming data. CDR 835 generates/recovers a 50% duty cycle clock signal used for sampling the incoming serial data 825. An accurate duty cycle clock signal reduces error rates in obtaining data from serial data 825. CDR 835 samples the serial data and then deserializes the sampled serial data in an embodiment of the present invention. Receive circuit 830 also includes an adaptive swing limiter circuit 840 for outputting differential output voltages responsive to incoming serial data 825. In an embodiment of the present invention, adaptive swing limiter circuit 840 is circuit 400 or 500 illustrated in FIGS. 4 and 5, respectively. Thus, an improved balanced differential output signal is provided by circuit 840 that leads to improved timing margin and data error rates.

Figure 9:
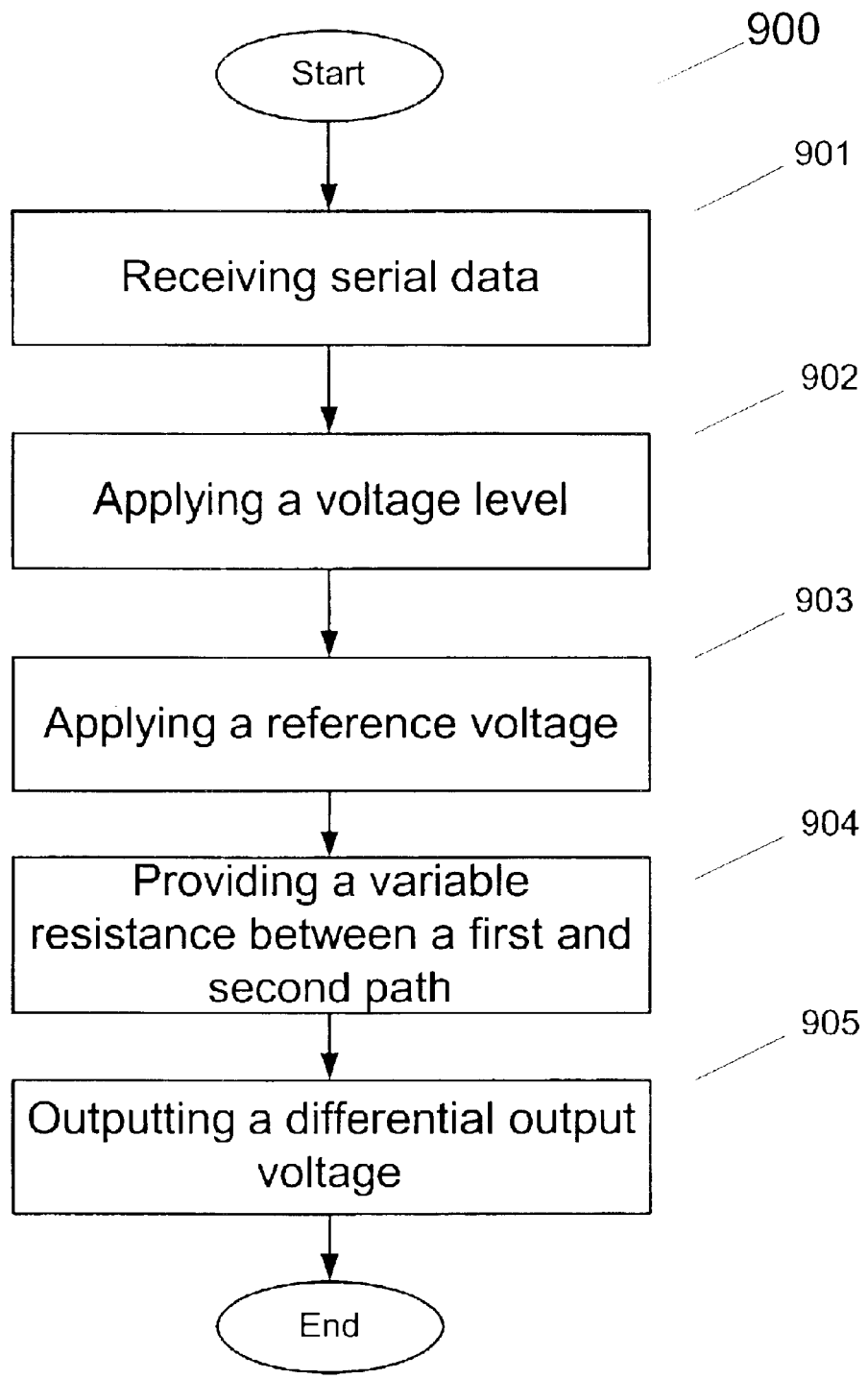
FIG. 9 illustrates a method in accordance with an embodiment of the present invention.

FIG. 9 illustrates a method 900 according to an embodiment of the present invention. In alternate embodiments of the present invention, steps illustrated in FIG. 9 are carried out by hardware, software or a combination thereof. In alternate embodiments, the steps illustrated in FIG. 9 are carried out by the components illustrated in FIGS. 4 and 5. As one of ordinary skill in the art would appreciate, other steps that are not shown may be included in various embodiments of the present invention.

Method 900 begins at step 901 where serial data is received. In an embodiment of the present invention, serial data 825 is received by receiving circuit 830 as illustrated in FIG. 8. An input voltage is then applied as illustrated by step 902. In an embodiment of the present invention, an input voltage $V_{IN}$ is applied to a gate of transistors 402 or 502 as illustrated in FIGS. 4 and 5, respectively. A reference voltage is then applied as illustrated by step 903. In an embodiment of the present invention, a reference voltage $V_{REF}$ is applied to gates of transistors 404 and 504 as illustrated in FIGS. 4 and 5, respectively. A variable resistance is applied between two electronic paths in step 904. In an embodiment of the present invention, variable resistor 410 and transistor 510 are provided between paths 420 and 430, and paths 520 and 530 illustrated in FIGS. 4 and 5, respectively. Step 905 illustrates outputting a differential output voltage. In an embodiment of the present invention, differential output voltage $V_{OUT}$ is provided from terminals 421 and 422, 521 and 522, shown in FIGS. 4 and 5, respectively.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A circuit, comprising:
   a voltage source;
   a current source coupled to a node;
   a first electrical path coupled to the voltage source and the node;
   a second electrical path coupled to the voltage source and the node;
   a first transistor having a first gate, a first drain and a first channel,
   wherein the first path includes the first channel and the first gate adapted to receive a reference voltage;
   a second transistor having a second gate, a second drain and a second channel, wherein the second path includes the second channel and the second gate adapted to receive a data voltage that is variable as a positive and negative voltage relative to the reference voltage;
   a first output terminal coupled to the first drain;
   a second output terminal coupled to the second drain; and,
   a variable resistor, coupled to the first electrical path and the second electrical path, to provide a predetermined resistance responsive to a node voltage at the node.

2. A circuit, comprising:
   a voltage source;
   a current source coupled to a node;
   a first electrical path coupled to the voltage source and the node;
   a second electrical path coupled to the voltage source and the node;
   a first transistor having a first gate and a first channel, wherein the first path includes the first channel and the first gate adapted to receive a reference voltage;
   a second transistor having a second gate and a second channel, wherein the second path includes the second channel and the second gate adapted to receive a data voltage that is variable as a positive and negative voltage relative to the reference voltage; and,
   a variable resistor, coupled to the first electrical path and the second electrical path, to provide a predetermined resistance responsive to a node voltage at the node; and,
   a signal processing circuit, coupled to the variable resistor and the node, to generate a control signal responsive to the node voltage.

3. The circuit of claim 2, wherein the circuit is a differential amplifier circuit used in a double data gate receiving circuit to improve a duty cycle clock signal.

4. The circuit of claim 2, wherein the circuit is in a memory device.

5. The circuit of claim 2, wherein the circuit is in a memory device controller.

6. A circuit, comprising:
   a voltage source;
   a current source coupled to a node;
   a first electrical path coupled to the voltage source and the node;
   a second electrical path coupled to the voltage source and the node;
   a first transistor having a first gate and a first channel, wherein the first path includes the first channel and the first gate adapted to receive a reference voltage;
   a second transistor having a second gate and a second channel, wherein the second path includes the second channel and the second gate adapted to receive a data voltage that is variable as a positive and negative voltage relative to the reference voltage;
   a third transistor having a third gate and a third channel, wherein the first path includes the third channel having a first resistance between the voltage source and the first transistor;
   a fourth transistor having a fourth gate and a fourth channel, wherein the second path includes the fourth channel having a second resistance between the voltage source and the second transistor;
   a variable resistor, coupled to the first electrical path and the second electrical path, to provide a predetermined resistance responsive to a node voltage at the node; and,
   a signal processing circuit, coupled to the variable resistor and the node, to generate a control signal responsive to the node voltage.

7. A circuit, comprising:
   a voltage source;
   a current source coupled to a node;
   a first electrical path coupled to the voltage source and the node;
   a second electrical path coupled to the voltage source and the node;
   a first transistor having a first gate and a first channel, wherein the first path includes the first channel and the first gate adapted to receive a reference voltage;
   a second transistor having a second gate and a second channel, wherein the second path includes the second channel and the second gate adapted to receive a data voltage that is variable as a positive and negative voltage relative to the reference voltage;
   a third transistor having a third gate and a third channel, wherein the first path includes the third channel having a first resistance between the voltage source and the first transistor;
   a fourth transistor having a fourth gate and a fourth channel, wherein the second path includes the fourth channel having a second resistance between the voltage source and the second transistor;
   a variable resistor, coupled to the first electrical path and the second electrical path, to provide a predetermined resistance responsive to a node voltage at the node; and,
   a signal processing circuit, coupled to the variable resistor and the node, to generate a control signal responsive to the node voltage,
   wherein the current source includes a fifth transistor having a drain coupled to the node and a source coupled to a ground, and wherein the fifth transistor has a gate adapted to receive a bias voltage.

8. A circuit, comprising:

a voltage source;

a current source coupled to a node;

a first electrical path coupled to the voltage source and the node;

a second electrical path coupled to the voltage source and the node;

a first transistor having a first gate and a first channel, wherein the first path includes the first channel and the first gate adapted to receive a reference voltage;

a second transistor having a second gate and a second channel, wherein the second path includes the second channel and the second gate adapted to receive a data voltage that is variable as a positive and negative voltage relative to the reference voltage;

a third transistor having a third gate and a third channel, wherein the first path includes the third channel having a first resistance between the voltage source and the first transistor;

a fourth transistor having a fourth gate and a fourth channel, wherein the second path includes the fourth channel having a second resistance between the voltage source and the second transistor;

a variable resistor, coupled to the first electrical path and the second electrical path, to provide a predetermined resistance responsive to a node voltage at the node; and, a signal processing circuit, coupled to the variable resistor and the node, to generate a control signal responsive to the node voltage, wherein the current source includes a fifth transistor having a drain coupled to the node and a source coupled to a ground, and wherein the fifth transistor has a gate adapted to receive a bias voltage, wherein the variable resistor includes a sixth transistor having a source, a drain and a gate, wherein the source is coupled to the first path and the drain is coupled to the second path.

9. A circuit, comprising:

a voltage source;

a current source coupled to a node;

a first electrical path coupled to the voltage source and the node;

a second electrical path coupled to the voltage source and the node;

a first transistor having a first gate and a first channel, wherein the first path includes the first channel and the first gate adapted to receive a reference voltage;

a second transistor having a second gate and a second channel, wherein the second path includes the second channel and the second gate adapted to receive a data voltage that is variable as a positive and negative voltage relative to the reference voltage;

a third transistor having a third gate and a third channel, wherein the first path includes the third channel having a first resistance between the voltage source and the first transistor;

a fourth transistor having a fourth gate and a fourth channel, wherein the second path includes the fourth channel having a second resistance between the voltage source and the second transistor;

a variable resistor, coupled to the first electrical path and the second electrical path, to provide a predetermined resistance responsive to a node voltage at the node; and, a signal processing circuit, coupled to the variable resistor and the node, to generate a control signal responsive to the node voltage, wherein the current source includes a fifth transistor having a drain coupled to the node and a source coupled to a ground, and wherein the fifth transistor has a gate adapted to receive a bias voltage, wherein the variable resistor includes a sixth transistor having a source, a drain and a gate, wherein the source is coupled to the first path and the drain is coupled to the second path, wherein the signal processing circuit includes a seventh transistor having a source, a drain and a gate, wherein the source is coupled to the voltage source and the gate is coupled to the sixth transistor gate, and an eighth transistor having a source, a drain and a gate, wherein the drain is coupled to the seventh transistor drain and the gate is coupled to the node.

10. A circuit, comprising:

a voltage source;

a current source coupled to a node;

a first electrical path coupled to the voltage source and the node;

a second electrical path coupled to the voltage source and the node;

a first transistor having a first gate and a first channel, wherein the first path includes the first channel and the first gate adapted to receive a reference voltage;

a second transistor having a second gate and a second channel, wherein the second path includes the second channel and the second gate adapted to receive a data voltage that is variable as a positive and negative voltage relative to the reference voltage;

a third transistor having a third gate and a third channel, wherein the first path includes the third channel having a first resistance between the voltage source and the first transistor;

a fourth transistor having a fourth gate and a fourth channel, wherein the second path includes the fourth channel having a second resistance between the voltage source and the second transistor;

a variable resistor, coupled to the first electrical path and the second electrical path, to provide a predetermined resistance responsive to a node voltage at the node; and, a signal processing circuit, coupled to the variable resistor and the node, to generate a control signal responsive to the node voltage, wherein the current source includes a fifth transistor having a drain coupled to the node and a source coupled to a ground, and wherein the fifth transistor has a gate adapted to receive a bias voltage, wherein the variable resistor includes a sixth transistor having a source, a drain and a gate, wherein the source is coupled to the first path and the drain is coupled to the second path, wherein the signal processing circuit includes a seventh transistor having a source, a drain and a gate, wherein the source is coupled to the voltage source and the gate is coupled to the sixth transistor gate, and an eighth transistor having a source, a drain and a gate, wherein the drain is coupled to the seventh transistor drain and the gate is coupled to the node, and wherein the first transistor, second transistor, fifth transistor, and eighth transistor are n-type transistors.

11. A circuit, comprising:
a voltage source;
a current source coupled to a node;
a first electrical path coupled to the voltage source and the node;
a second electrical path coupled to the voltage source and the node;
a first transistor having a first gate and a first channel, wherein the first path includes the first channel and the first gate adapted to receive a reference voltage;
a second transistor having a second gate and a second channel, wherein the second path includes the second channel and the second gate adapted to receive a data voltage that is variable as a positive and negative voltage relative to the reference voltage;
a third transistor having a third gate and a third channel, wherein the first path includes the third channel having a first resistance between the voltage source and the first transistor;
a fourth transistor having a fourth gate and a fourth channel, wherein the second path includes the fourth channel having a second resistance between the voltage source and the second transistor;
a variable resistor, coupled to the first electrical path and the second electrical path, to provide a predetermined resistance responsive to a node voltage at the node; and,
a signal processing circuit, coupled to the variable resistor and the node, to generate a control signal responsive to the node voltage,
wherein the current source includes a fifth transistor having a drain coupled to the node and a source coupled to a ground, and wherein the fifth transistor has a gate adapted to receive a bias voltage,
wherein the variable resistor includes a sixth transistor having a source, a drain and a gate, wherein the source is coupled to the first path and the drain is coupled to the second path,
wherein the signal processing circuit includes a seventh transistor having a source, a drain and a gate, wherein the source is coupled to the voltage source and the gate is coupled to the sixth transistor gate, and an eighth transistor having a source, a drain and a gate, wherein the drain is coupled to the seventh transistor drain and the gate is coupled to the node,
wherein the first transistor, second transistor, fifth transistor, and eighth transistor are n-type transistors, and
wherein the third transistor, fourth transistor, sixth transistor and seventh transistor are p-type transistors.

12. A differential amplifier circuit having a voltage source and a current source coupled to a node, comprising:
a first electrical path coupled to the voltage source and the node;
a second electrical path coupled to the voltage source and the node;
a first transistor having a first gate and a first channel, wherein the first path includes the first channel and the first gate adapted to receive a reference voltage;
a second transistor having a second gate and a second channel, wherein the first path includes the second channel and the second gate adapted to receive serial data having a voltage level;
a variable resistor, coupled to the first electrical path and the second electrical path, to provide a predetermined resistance responsive to a control signal; and,
a signal processing circuit, coupled to the variable resistor and the node, to generate a control signal responsive to the node voltage.

13. The differential amplifier circuit of claim 12, wherein the circuit further comprises:
a third transistor having a third gate and a third channel, wherein the first path includes the third channel having a first resistance between the voltage source and the first transistor; and,
a fourth transistor having a fourth gate and a fourth channel, wherein the second path includes the fourth channel having a second resistance between the voltage source and the second transistor.

14. The differential amplifier circuit of claim 13, wherein the current source includes a fifth transistor having a drain coupled to the node and a source coupled to a ground, and wherein the fifth transistor has a gate adapted to receive a bias voltage.

15. The differential amplifier circuit of claim 14, wherein the variable resistor includes a sixth transistor having a source, a drain and a gate, wherein the source is coupled to the first path and the drain is coupled to the second path.

16. The differential amplifier circuit of claim 15, wherein the signal processing circuit comprises:
a seventh transistor having a source, a drain and a gate, wherein the source is coupled to the voltage source and the gate is coupled to the sixth transistor gate; and,
an eighth transistor having a source, a drain and a gate, wherein the drain is coupled to the seventh transistor drain and the gate is coupled to the node.

17. An apparatus, comprising:
a transmit circuit to transmit serial data; and,
a receive circuit, coupled to the transmit circuit, to generate an output signal responsive to the serial data, wherein the receive circuit includes:
a voltage source;
a current source coupled to a node;
a first electrical path coupled to the voltage source and the node;
a second electrical path coupled to the voltage source and the node;
a first transistor having a first gate, a first drain and a first channel, wherein the first path includes the first channel and the first gate adapted to receive a reference voltage;
a second transistor having a second gate, a second drain and a second channel, wherein the first path includes the second channel and the second gate adapted to receive a data voltage, corresponding the serial data, that is variable as a positive and negative voltage relative to the reference voltage;
a first output terminal coupled to the first drain;
a second output terminal coupled to the second drain; and,
a variable resistor, coupled to the first electrical path and the second electrical path, to provide a predetermined resistance responsive to a node voltage at the node.

18. The apparatus of claim 17, wherein the transmit circuit is included in a memory controller and the receive circuit is included in a memory device.

19. The apparatus of claim 18, wherein the receive circuit is a differential amplifier circuit used for improving a duty cycle clock signal.

20. An apparatus, comprising:
a transmit circuit to transmit serial data; and, a receive circuit, coupled to the transmit circuit, to generate an output signal responsive to the serial data, wherein the receive circuit includes:
a voltage source;
a current source coupled to a node;
a first electrical path coupled to the voltage source and the node;
a second electrical path coupled to the voltage source and the node;
a first transistor having a first gate and a first channel, wherein the first path includes the first channel and the first gate adapted to receive a reference voltage;
a second transistor having a second gate and a second channel, wherein the first path includes the second channel and the second gate adapted to receive a data voltage, corresponding the serial data, that is variable as a positive and negative voltage relative to the reference voltage;
a variable resistor, coupled to the first electrical path and the second electrical path, to provide a predetermined resistance responsive to a node voltage at the node; and,
a signal processing circuit, coupled to the variable resistor and the node, to generate a control signal responsive to the node voltage.

21. An apparatus, comprising:
a transmit circuit to transmit serial data; and,
a receive circuit, coupled to the transmit circuit, to generate an output signal responsive to the serial data, wherein the receive circuit includes:
a voltage source;
a current source coupled to a node;
a first electrical path, coupled to the voltage source and the node;
a second electrical path coupled to the voltage source and the node;
a first transistor having a first gate and a first channel, wherein the first path includes the first channel and the first gate adapted to receive a reference voltage;
a second transistor having a second gate and a second channel, wherein the first path includes the second channel and the second gate adapted to receive a data voltage, corresponding the serial data that is variable as a positive and negative voltage relative to the reference voltage;
a third transistor having a third gate and a third channel, wherein the first path includes the third channel having a first resistance between the voltage source and the first transistor;
a fourth transistor having a fourth gate and a fourth channel, wherein the second path includes the fourth channel having a second resistance between the voltage source and the second transistor;
a variable resistor, coupled to the first electrical path and the second electrical path, to provide a predetermined resistance responsive to a node voltage at the node; and,
a signal processing circuit, coupled to the variable resistor and the node, to generate a control signal responsive to the node voltage.

22. An apparatus, comprising:
a transmit circuit to transmit serial data; and,
a receive circuit, coupled to the transmit circuit, to generate an output signal responsive to the serial data wherein the receive circuit includes:
a voltage source;
a current source coupled to a node;
a first electrical path coupled to the voltage source and the node;
a second electrical path coupled to the voltage source and the node;
a first transistor having a first gate and a first channel, wherein the first path includes the first channel and the first gate adapted to receive a reference voltage;
a second transistor having a second gate and a second channel, wherein the first path includes the second channel and the second gate adapted to receive a data voltage, corresponding the serial data, that is variable as a positive and negative voltage relative to the reference voltage;
a third transistor having a third gate and a third channel, wherein the first path includes the third channel having a first resistance between the voltage source and the first transistor;
a fourth transistor having a fourth gate and a fourth channel, wherein the second path includes the fourth channel having a second resistance between the voltage source and the second transistor;
a variable resistor, coupled to the first electrical path and the second electrical path, to provide a predetermined resistance responsive to a node voltage at the node; and,
a signal processing circuit, coupled to the variable resistor and the node, to generate a control signal responsive to the node voltage,
wherein the current source includes a fifth transistor having a drain coupled to the node and a source coupled to a ground, and wherein the fifth transistor has a gate adapted to receive a bias voltage.

23. An apparatus, comprising:
a transmit circuit, to transmit serial data; and,
a receive circuit, coupled to the transmit circuit, to generate art output signal responsive to the serial data, wherein the receive circuit includes:
a voltage source;
a current source coupled to a node;
a first electrical path coupled to the voltage source and the node;
a second electrical path coupled to the voltage source and the node;
a first transistor having a first gate and a first channel, wherein the first path includes the first channel and the first gate adapted to receive a reference voltage;
a second transistor having a second gate and a second channel, wherein the first path includes the second channel and the second gate adapted to receive a data voltage, corresponding the serial data, that is variable as a positive and negative voltage relative to the reference voltage;
a third transistor having a third gate and a third channel, wherein the first path includes the third channel having a first resistance between the voltage source and the first transistor;
a fourth transistor having a fourth gate and a fourth channel, wherein the second path includes the fourth channel having second resistance between the voltage source and the second transistor;
a variable resistor, coupled to the first electrical path and the second electrical path, to provide a predetermined resistance responsive to a node voltage at the node; and,
a signal processing a circuit, coupled to the variable resistor and the node, to generate a control signal responsive to the node voltage, wherein the current source includes a fifth transistor having a drain coupled to the node and a source coupled to a ground, and wherein the fifth transistor has a gate adapted to receive a bias voltage, wherein the variable resistor includes a sixth transistor having a source, a drain and a gate, wherein the source is coupled to the first path and the drain is coupled to the second path.

24. An apparatus, comprising:

a transmit circuit to transmit serial data; and, a receive circuit, coupled to the transmit circuit, to generate an output signal responsive to the serial data, wherein the receive circuit, includes:

a voltage source;

a current source coupled to a node;

a first electrical path coupled to the voltage source and the node;

a second electrical path coupled to the voltage source and the node;

a first transistor having a first gate and a first channel, wherein the first path includes the first channel and the first gate adapted to receive a reference voltage;

a second transistor having a second gate and a second channel, wherein the first path includes the second channel and the second gate adapted to receive a data voltage, corresponding the serial data, that is variable as a positive and negative voltage relative to the reference voltage;

a third transistor having a third gate and a third channel, wherein the first path includes the third channel having a first resistance between the voltage source and the first transistor;

a fourth transistor having a fourth gate and a fourth channel, wherein the second path includes the fourth channel having a second resistance between the voltage source and the second transistor;

a variable resistor, coupled to the first electrical path and the second electrical path, to provide a predetermined resistance responsive to a node voltage at the node; and, a signal processing circuit, coupled to the variable resistor and the node, to generate a control signal responsive to the node voltage, wherein the current source includes a fifth transistor having a drain coupled to the node and a source coupled to a ground, and wherein the fifth transistor has a gate adapted to receive a bias voltage, wherein the variable resistor includes a sixth transistor having a source, a drain and a gate, wherein the source is coupled to the first path and the drain is coupled to the second path, wherein the signal processing circuit includes a seventh transistor having a source, a drain and a gate, wherein the source is coupled to the voltage source and the gate is coupled to the sixth transistor gate, and an eighth transistor having a source, a drain and a gate, wherein the drain is coupled to the seventh transistor drain and the gate is coupled to the node.

25. An apparatus, comprising:

a transmit circuit to transmit serial data; and, a receive circuit, coupled to the transmit circuit, to generate an output signal responsive to the serial data, wherein the receive circuit includes:

a voltage source;

a current source coupled to a node;

a first electrical path coupled to the voltage source and the node;

a second electrical path coupled to the voltage source and the node;

a first transistor having a first gate and a first channel, wherein the first path includes the first channel and the first gate adapted to receive a reference voltage;

a second transistor having a second gate and a second channel, wherein the first path includes the second channel and the second gate adapted to receive a data voltage, corresponding the serial data, that is variable as a positive and negative voltage relative to the reference voltage;

a third transistor having a third gate and a third channel, wherein the first path includes the third channel having a first resistance between the voltage source and the first transistor;

a fourth transistor having a fourth gate and a fourth channel, wherein the second path includes the fourth channel having a second resistance between the voltage source and the second transistor;

a variable resistor, coupled to the first electrical path and the second electrical path, to provide a predetermined resistance responsive to a node voltage at the node; and, a signal processing a circuit, coupled to the variable resistor and the node, to generate a control signal responsive to the node voltage, wherein the current source includes a fifth transistor having a drain coupled to the node and a source coupled to a ground, and wherein the fifth transistor has a gate adapted to receive a bias voltage, wherein the variable resistor includes a sixth transistor having a source, a drain and a gate, wherein the source is coupled to the first path and the drain is coupled to the second path, wherein the signal processing circuit includes a seventh transistor having a source, a drain and a gate, wherein the source is coupled to the voltage source and the gate is coupled to the sixth transistor gate, and an eighth transistor having a source, a drain and a gate, wherein the drain is coupled to the seventh transistor drain and the gate is coupled to the node; and, wherein the first transistor, second transistor, fifth transistor, and eighth transistor are n-type transistors.

26. An apparatus, comprising:

transmit circuit to transmit serial data; and, a receive circuit, coupled to the transmit circuit, to generate an output signal responsive to the serial data, wherein the receive circuit includes:

a voltage source;

a current source coupled to a node;

a first electrical path coupled to the voltage source and the node;

a second electrical path coupled to the voltage source and the node;

a first transistor having a first gate and a first channel, wherein the first path includes the first channel and the first gate adapted to receive a reference voltage;

a second transistor having a second gate and a second channel, wherein the first path includes the second channel and the second gate adapted to receive a data voltage, corresponding the serial data, that is variable as a positive and negative voltage relative to the reference voltage;

a third transistor having a third gate and a third channel, wherein the first path includes the third channel having a first resistance between the voltage source and the first transistor;

a fourth transistor having a fourth gate and a fourth channel, wherein the second path includes the fourth channel having a second resistance between the voltage source and the second transistor;

a variable resistor, coupled to the first electrical path and the second electrical path, to provide a predetermined resistance responsive to a node voltage at the node; and, a signal processing circuit, coupled to the variable resistor and the node, to generate a control signal responsive to the node voltage, wherein the current source includes a fifth transistor having a drain coupled to the node and a source coupled to a ground, and wherein the fifth transistor has a gate adapted to receive a bias voltage, wherein the variable resistor includes a sixth transistor having a source, a drain and a gate, wherein the source is coupled to the first path and the drain is coupled to the second path, wherein the signal processing circuit includes a seventh transistor having a source, a drain and a gate, wherein the source is coupled to the voltage source and the gate is coupled to the sixth transistor gate, and an eighth transistor having a source, a drain and a gate, wherein the drain is coupled to the seventh transistor drain and the gate is coupled to the node, wherein the first transistor, second transistor, fifth transistor, and eighth transistor are n-type transistors, wherein the third transistor, fourth transistor, sixth transistor and seventh transistor are p-type transistors.

27. A method, comprising:

receiving serial data having a voltage level;

applying the voltage level to a first transistor drain in a first electrical path;

applying a reference voltage to a second transistor drain in a second electrical path; wherein the first electrical path is coupled to the second electrical path at a node;

providing a variable resistance between the first electrical path and the second electrical path responsive to a voltage at the node; and, outputting an output voltage from the first and second electrical paths.

28. The method of claim 27, further comprising:

applying a voltage source to the first and second electrical paths; and, applying a current source to the node.

29. The method of claim 28, further comprising:

generating a duty cycle clock signal responsive to the output voltage.

* * * * *